US007269551B2

(12) United States Patent
Yamazaki et al.

(10) Patent No.: US 7,269,551 B2
(45) Date of Patent: Sep. 11, 2007

(54) APPARATUS INCLUDING AN ERROR DETECTOR AND A LIMITER FOR DECODING AN ADAPTIVE DIFFERENTIAL PULSE CODE MODULATION RECEIVING SIGNAL

(75) Inventors: Kiyohiko Yamazaki, Kanagawa (JP); Manabu Mitsukude, Oita (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 898 days.

(21) Appl. No.: 09/996,929

(22) Filed: Nov. 30, 2001

(65) Prior Publication Data

US 2002/0107685 A1 Aug. 8, 2002

(30) Foreign Application Priority Data

Feb. 8, 2001 (JP) ............................ 2001-032588

(51) Int. Cl.
*H03K 5/08* (2006.01)
*G10L 19/14* (2006.01)
*G10L 19/00* (2006.01)

(52) U.S. Cl. ...................... 704/212; 704/225; 327/309

(58) Field of Classification Search .................... None
See application file for complete search history.

(56) References Cited

U.S. PATENT DOCUMENTS

| | | | | |
|---|---|---|---|---|
| 3,639,779 | A * | 2/1972 | Garrigus | 327/180 |
| 4,575,863 | A * | 3/1986 | Butcher et al. | 375/365 |
| 4,612,507 | A * | 9/1986 | Wisniewski | 327/318 |
| 5,309,443 | A * | 5/1994 | Schorman | 714/708 |
| 5,521,941 | A * | 5/1996 | Wiatrowski et al. | 375/287 |
| 5,535,299 | A * | 7/1996 | Riedel | 704/212 |
| 5,896,576 | A * | 4/1999 | Walley et al. | 455/570 |
| 5,925,146 | A * | 7/1999 | Murata et al. | 714/746 |

FOREIGN PATENT DOCUMENTS

| | | | |
|---|---|---|---|
| JP | 06244809 | A * | 9/1994 |
| JP | 09307513 | A * | 11/1997 |

OTHER PUBLICATIONS

IEEE, "IEEE 100—The Authoritative Dictionary of IEEE Standards Terms", 7th ed, New York: IEEE Press, 2000, p. 617.*

* cited by examiner

*Primary Examiner*—David Hudspeth
*Assistant Examiner*—Brian Albertalli
(74) *Attorney, Agent, or Firm*—Rabin & Berdo, P.C.

(57) ABSTRACT

An apparatus for decoding encoded voice data comprises a demodulator (101) which demodulates the encoded voice data (RF) and provides a demodulated encoded voice data (APO, RD), an adaptive differential pulse code modulation decoder (102) which decodes the demodulated encoded voice data and provides a pulse code modulation data (PO), an error detector (103) which detects whether error is present in the encoded voice data based on the demodulated encoded voice data and outputs a detection result (CRCERR) and a limiter (104) which outputs either the pulse code modulation data (POL) or a limit data (POL) in accordance with the detection result (CRCERR).

15 Claims, 19 Drawing Sheets

APPARATUS INCLUDING AN ERROR DETECTOR AND A LIMITER FOR DECODING AN ADAPTIVE DIFFERENTIAL PULSE CODE MODULATION RECEIVING SIGNAL

BACKGROUND OF THE INVENTION

1. Field of the Invention

The present invention generally relates to digital communications, and more particularly, to an apparatus for decoding encoded voice signal.

This application is a counterpart of Japanese patent application, Serial Number 32588/2001, filed Feb. 8, 2001, the subject matter of which is incorporated herein by reference.

2. Description of the Related Art

Pulse code modulation (PCM) code is one of the codes which modulate an analog voice signal to a digital data. PCM code is sampled the analog voice signal every a certain timing as a digital data and is stored one. The quality of the digital data depends on the number of sampling per second (sampling frequency) and the number of bits of the data (sample quantizing level). For example, the standard systems, the Cordless Telephone II(CT2), specify sampling at 8 kHz and quantizing to 15 levels. Adaptive differential pulse code modulation (ADPCM)

SUMMARY OF THE INVENTION

It is an object of the present invention to provide an apparatus for decoding receiving signal that may improve the quality of a telephone conversation even if ADPCM data has transmission errors.

According to one aspect of the present invention, for achieving the above object, there is provided an apparatus for decoding receiving encoded voice data, is provided with a demodulator which demodulates the encoded voice data and provides a demodulated encoded voice data, an adaptive differential pulse code modulation decoder which decodes the demodulated encoded voice data and provides a pulse code modulation data, an error detector which detects whether error is present in the encoded voice data and outputs a detection result and a limiter which outputs either the pulse code modulation data or a predetermined value in accordance with the detection result.

The above and further objects and novel features of the invention will more fully appear from the following detailed description, appended claims and the accompanying drawings.

DETAILED DESCRIPTION OF THE PREFERRED EMBODIMENTS

In what follows, the present invention will be explained with embodiments of the present invention. However, the invention is not limited to the specific embodiments. Moreover, not all the combinations of the characteristics of the present invention described in the embodiments are essential to the problem solving means by the present invention.

Figures 19, 19A, 19B:
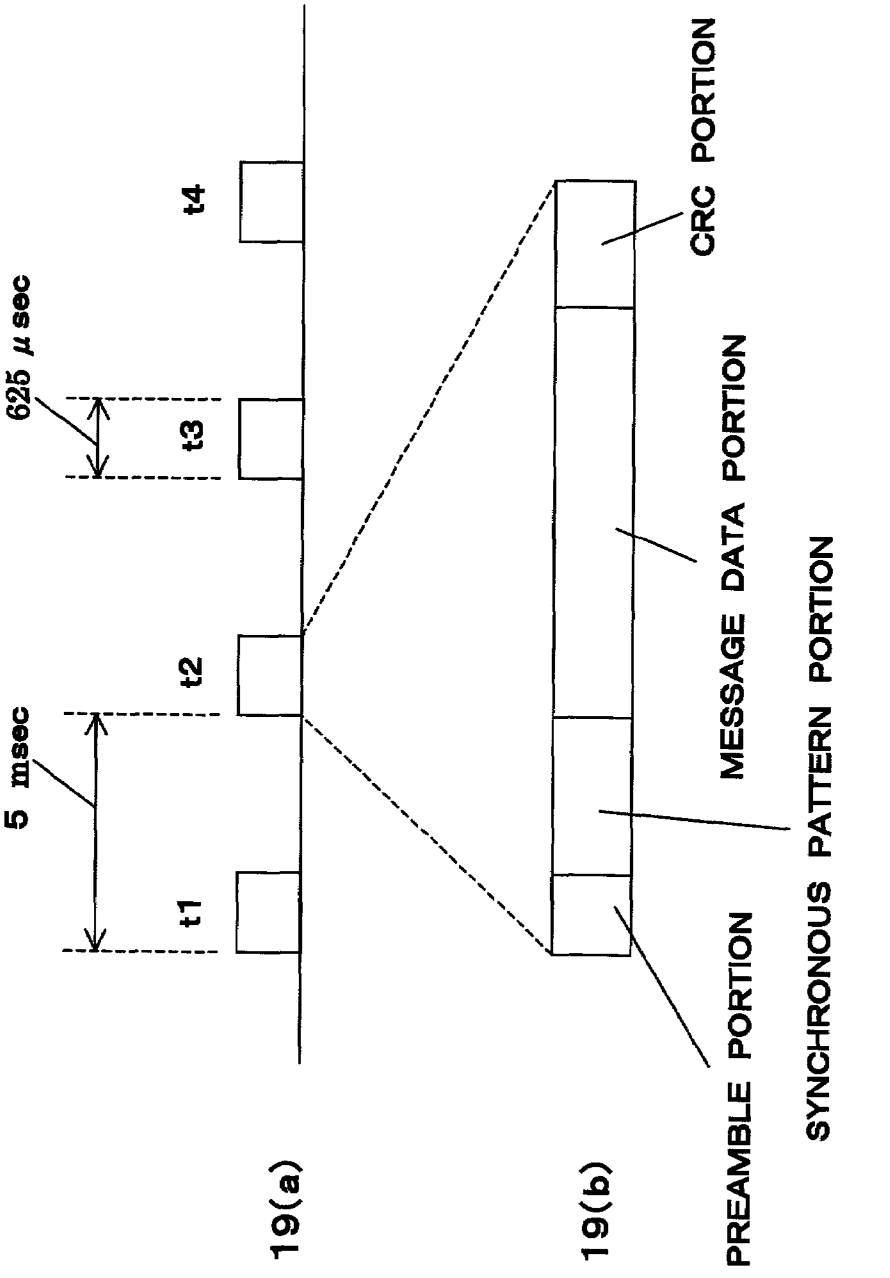
FIG. 19 is the structure of a burst signal used by the embodiments of the present invention.

First, a burst signal (radio signal) which is received by a decoding apparatus for TDMA systems at every certain timing will be described with FIG. 19. As shown in FIG. 19(*a*), the burst signal t1, t2 , , , is received at every 5 msec (millisecond) in the talking mode or at every an integer times of 5 msec in the waiting mode. Each burst signal t1, t2 , , , comprises a frame which has 625 μsec (microsecond) in length. As shown in FIG. 19(*b*), the frame has a preamble portion, a synchronous pattern portion followed by the preamble portion, a message data portion followed by the synchronous pattern portion and a CRC (cyclic redundancy check) data portion followed by the message data portion. In addition, the frame has a control data portion et al such as guard bits.

The preamble portion stores phase information (information for locking initial phase) which is used for right capturing the burst signal transmitted by a transmitter. The synchronous pattern portion stores synchronous pattern information that is used for detecting synchronism of the burst signal at a receiver. A detecting synchronism is called as aquisition. The message data portion stores voice information. The CRC portion is data portion for detecting error and stores an error correcting code information that is used for detecting or correcting an error in the burst signal.

The decoding apparatus is capable of being provided in the transmitter or the receiver.

(First Preferred Embodiment)

Figure 1:
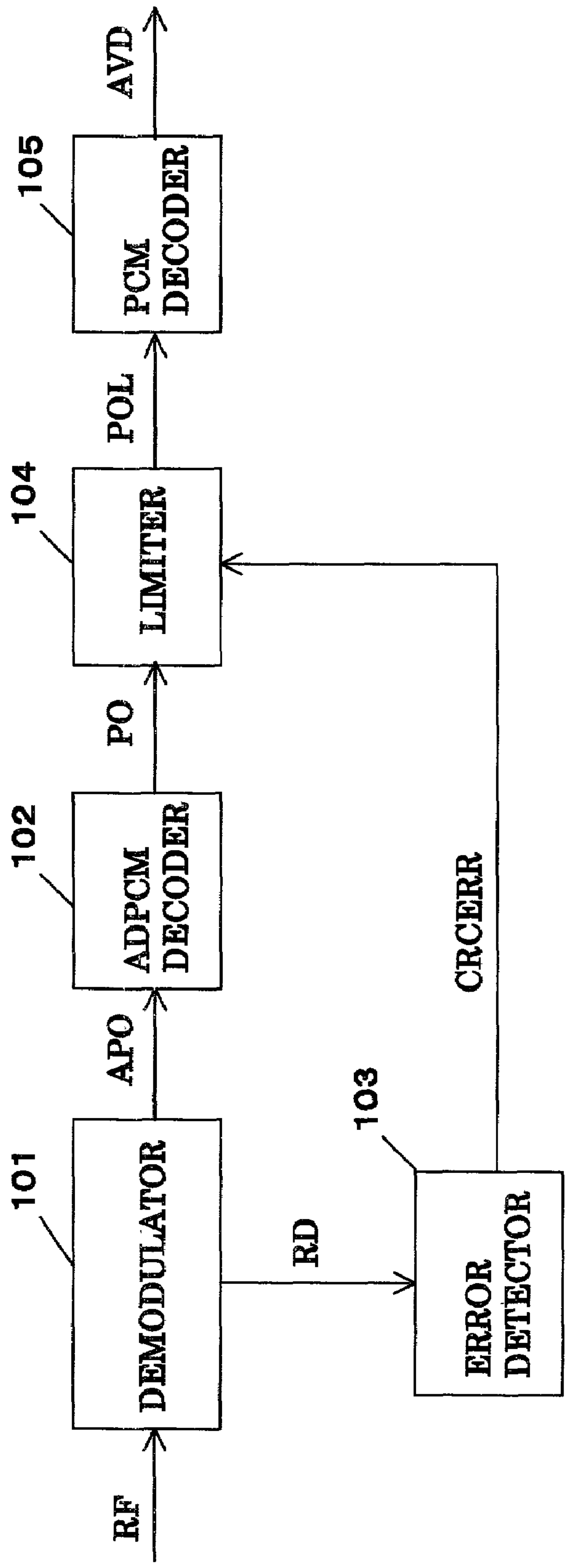
FIG. 1 is a block diagram showing a decoding apparatus according to a first preferred embodiment of the present invention.
Figure 2:
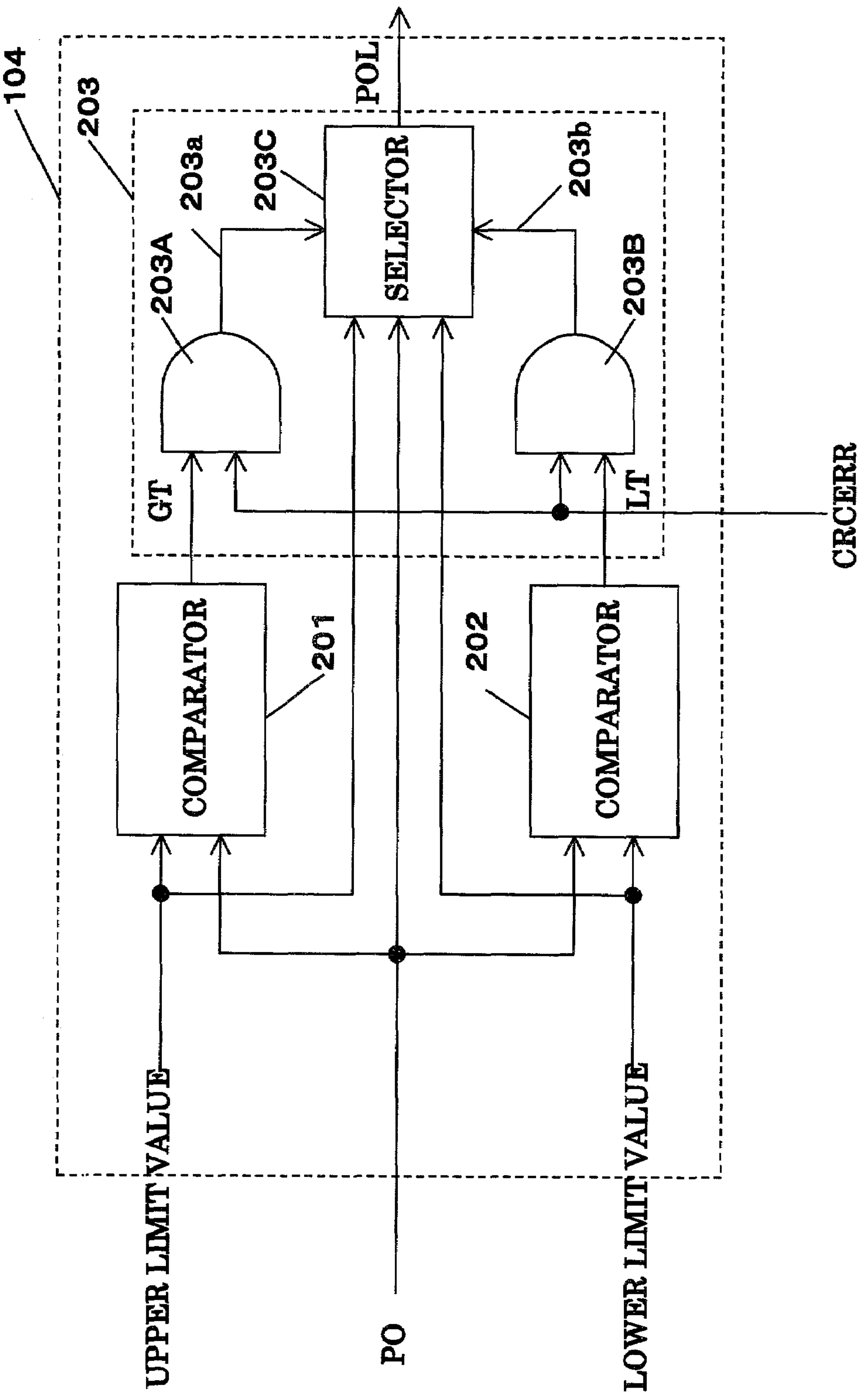
FIG. 2 is a block diagram showing a first limiter portion being used in a first, a second or a third preferred embodiments of the present invention.
Figure 3:
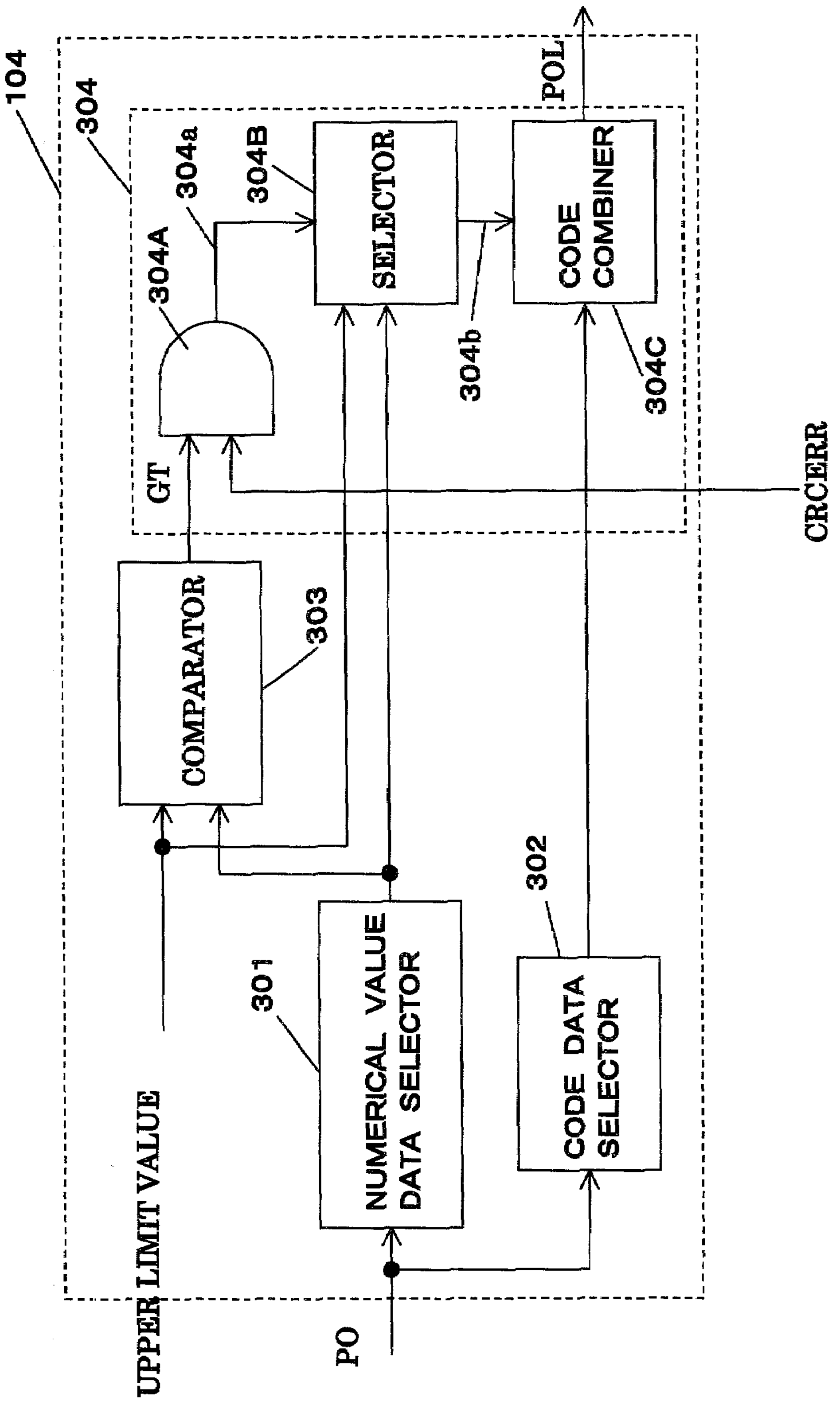
FIG. 3 is a block diagram showing a second limiter portion being used in a first, a second or a third preferred embodiments of the present invention.
Figure 4:
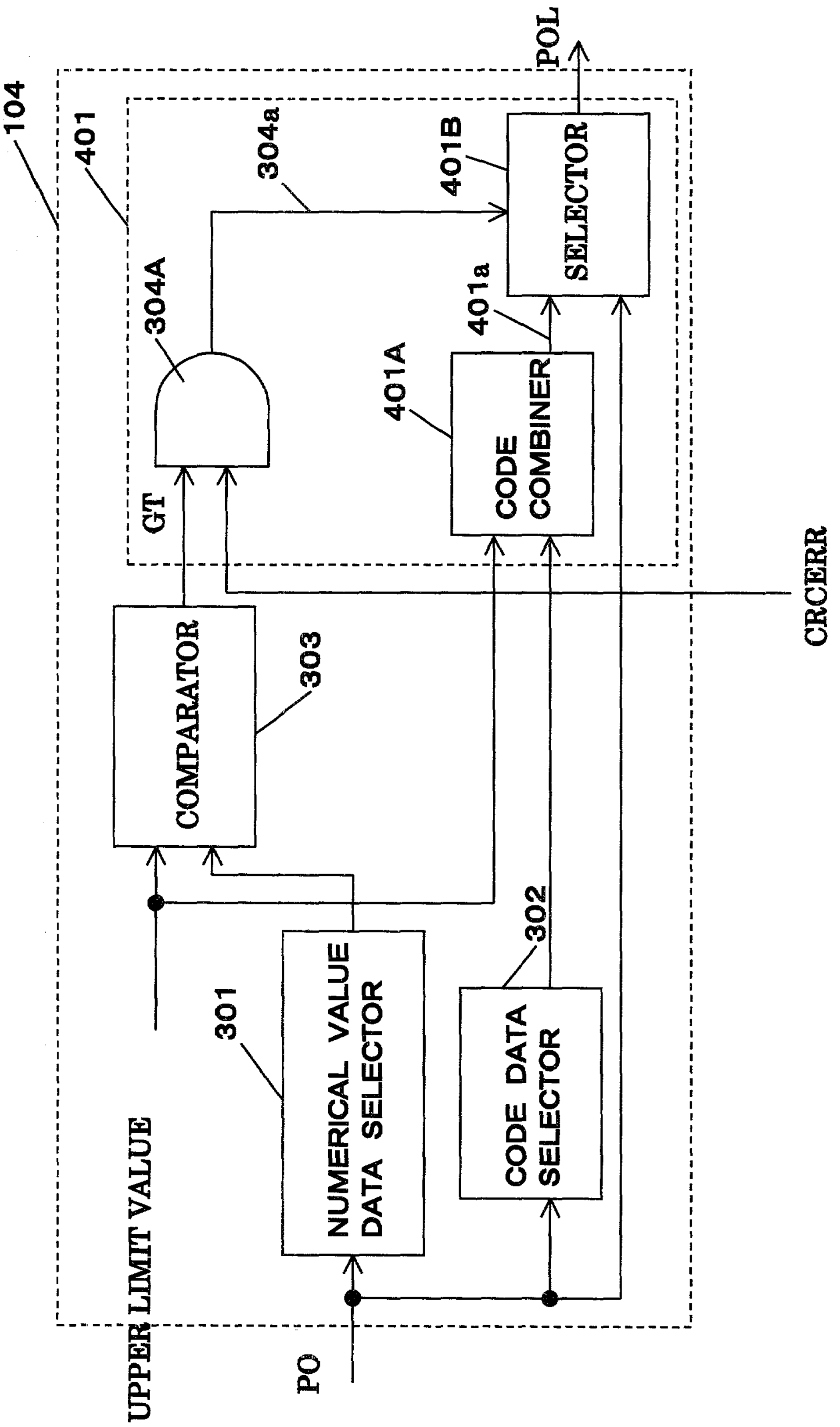
FIG. 4 is a block diagram showing a third limiter portion being used in a first, a second or a third preferred embodiments of the present invention.
Figure 5:
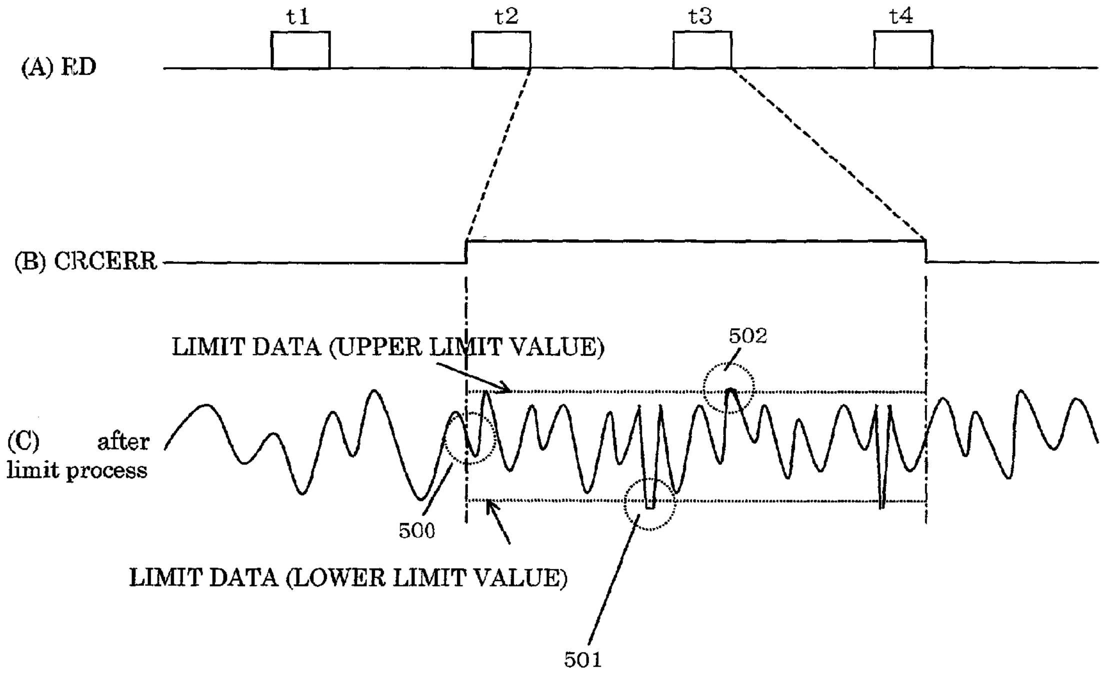
FIG. 5 is a wave form chart output by a decoding apparatus according to a first preferred embodiment of the present invention.

A decoding apparatus for decoding encoded voice signal according to a first preferred embodiment of the present invention will be described with reference to FIGS. 1–5. FIG. 1 is a block diagram showing the structure of the decoding apparatus having a limiter portion. FIGS. 2–4 are block diagrams showing the structure of the limiter portions of the decoding apparatus. FIG. 5 shows a wave form chart output by the decoding apparatus according to the first preferred embodiment of the present invention.

First, the structure and operation of the decoding apparatus according to the first preferred embodiment of the present invention will be described. The decoding apparatus according to the first preferred embodiment of the present invention comprises a demodulator 101, an ADPCM decoder 102, an error detector 103, a limiter 104 and a PCM decoder 105.

The demodulator 101 locks a phase of the received burst signal in accordance with phase information stored in the preamble portion of a radio signal (the received burst signal) RF. The demodulator 101 demodulates voice information which is stored in the message data portion and error correcting code information which is stored in the CRC data portion, and outputs ADPCM format data (ADPCM signal) APO and demodulated data (demodulated signal) RD.

The ADPCM decoder 102 decodes the ADPCM format data APO and outputs PCM format data (PCM signal) PO.

The error detector 103 detects whether the radio signal RF has a transmission error in accordance with an error data in the demodulated data RD. When the error is detected, the error detector 103 outputs a detection result (a detection signal) CRCERR which has a supply voltage level ('H' level). On the other hand, when the error is not detected, the error detector 103 outputs the detection result CRCERR which has a ground voltage level ('L' level).

The limiter 104 has a limit value. The limiter 104 outputs either the PCM format data PO or the limit value as a PCM format data POL in accordance with the voltage level of the detection result CRCERR. The limiter 104 will be described later in detail.

The PCM decoder 105 decodes the PCM format data POL and outputs an analog voice data (analog voice signal) AVD.

The limiter 104 will be described with reference to FIGS. 2–4. FIG. 2 shows a first limiter, FIG. 3 shows a second limiter and FIG. 4 shows a third limiter.

First, the first limiter 104 will be described with FIG. 2 as follows. The first limiter 104 comprises a comparator 201, a comparator 202 and an output portion 203. The output portion 203 comprises a logic product (AND gate) 203A, a logic product 203B and a selector 203C. The first limiter 104 has an upper limit value and a lower limit value. The upper limit value is the largest amplitude value of a voice signal of which level is that the reproduced voice signal does not have noise. The lower limit value is the smallest amplitude value of a voice signal of which level is that the reproduced voice signal does not have noise.

The comparator 201 compares the amplitude value of the PCM format data PO with the upper limit value. When the amplitude value of the PCM format data PO is larger than the upper limit value, the comparator 201 outputs a comparison result GT which has 'H' level. On the other hand, when the amplitude value of the PCM format data PO is smaller than the upper limit value, the comparator 201 outputs a comparison result GT which has 'L' level.

The comparator 202 compares the amplitude value of the PCM format data PO with the lower limit value. When the amplitude value of the PCM format data PO is smaller than the lower limit value, the comparator 202 outputs a comparison result LT which has 'H' level. On the other hand, when the amplitude value of the PCM format data PO is larger than the lower limit value, the comparator 202 outputs a comparison result LT which has 'L' level.

The logic product 203A operates a logic product between the detection result CRCERR and the comparison result GT. When both of the voltage level of the detection result CRCERR and the comparison result GT are 'H' level, the logic product 203A outputs a logic product result 203*a* which has 'H' level. On the other hand, when the voltage level of the detection result CRCERR or the comparison result GT is 'L' level, the logic product 203A outputs the logic product result 203*a* which has 'L' level.

The logic product 203B operates a logic product between the detection result CRCERR and the comparison result LT. When both of the voltage level of the detection result CRCERR and the comparison result LT are 'H' level, the logic product 203B outputs a logic product result 203*b* which has 'H' level. On the other hand, when the voltage level of the detection result CRCERR or the comparison result LT is 'L' level, the logic product 203B outputs the logic product result 203*b* which has 'L' level.

The selector 203C outputs the upper limit value as the PCM format data POL when the logic product result 203*a* has 'H' level and the lower limit value as the PCM format data POL when the logic product result 203*b* has 'H' level. Furthermore, the selector 203C outputs the PCM format data PO as the PCM format data POL when both the logic product result 203*a* and the logic product result 203*b* have 'L' level.

According to the first limiter 104, the upper limit value and the lower limit value can be set up, individually and freely. Therefore, the user can obtain the analog voice signal which has a desired band.

Next, the second limiter 104 will be described with FIG. 3 as follows. The second limiter 104 comprises a numerical value data selector 301, a code data selector 302, a comparator 303 and an output portion 304. The output portion 304 comprises a logic product (AND gate) 304A, a selector 304B and a code combiner 304C. The second limiter 104 has an upper limit value of which format is the absolute value. The upper limit value is the greatest common absolute value between the absolute value of the largest amplitude value of a voice signal and the absolute value of the smallest amplitude value of a voice signal. Even if the voice signal having the level of the largest amplitude value is reproduced, the reproduced voice signal does not have noise. Even if the voice signal having the level of the smallest amplitude value is reproduced, the reproduced voice signal does not have noise. For example, when the largest amplitude value of the voice signal is +12 (plus 12) and when the smallest amplitude value is −10 (minus 10), the upper limit value X which satisfies an expression $|+12| \geqq X$ and $|-10| \geqq X$ is 10 ($X=10$). In this case, the upper limit value is '10'.

The numerical value data selector 301 selects a numerical value data of the PCM format data PO. For example, when the PCM format data PO comprises 4 bits, the most significant bit (MSB) indicates the code data and the other 3 bits except for the MSB indicate the numerical value data. The numerical value data selector 301 selects 3 bits except for the MSB as the numerical value data.

The code data selector 302 selects a code data of the PCM format data PO. In the above case, the code data selector 302 selects the MSB as the code data.

The comparator 303 compares the upper limit value of which format is the absolute value and the numerical value data of the PCM format data PO. When the numerical value data is larger than the upper limit value, the comparator 303 outputs a comparison result GT which has 'H' level. On the other hand, when the numerical value data is smaller than the upper limit value, the comparator 303 outputs a comparison result GT which has 'L' level.

The logic product 304A operates a logic product between the detection result CRCERR and the comparison result GT. When both of the voltage level of the detection result CRCERR and the comparison result GT are 'H' level, the logic product 304A outputs a logic product result 304*a* which has 'H' level. On the other hand, when the voltage level of the detection result CRCERR or the comparison result GT is 'L' level, the logic product 304A outputs the logic product result 304*a* which has 'L' level.

The selector 304B selects the upper limit value when the logic product result 304*a* has 'H' level and outputs one as a selection result 304*b*. Furthermore, the selector 304B selects the numerical value data of the PCM format data PO when the logic product result 304*a* has 'L' level and outputs one as a selection result 304*b*.

The code combiner 304C combines the selection result 304*b* with the code data of the PCM format data PO and outputs one as the PCM format data POL. By the way, the number of bits of the upper limit data is the same as the number of bits of the numerical value data of the PCM format data PO. For example, the numerical value data of the PCM format data PO and the upper limit data comprise 3 bits In the above case, the code combiner 304C adds the code data of the PCM Format data PO which comprises one-bit to the front position of the most significant bit of the selection result signal 304*b*. The number of bits of the PCM formal data POL becomes 4 bits.

According to the second limiter 104, the upper limit value and the lower limit value of the first limiter can be combined as one limit value. Therefore, the second limiter 104 can save the capacitance of the memory which stores the limit value.

Next, the third limiter 104 will be described with FIG. 4 as follows. The third limiter 104 comprises a numerical value data selector 301, a code data selector 302, a comparator 303 and an output portion 401. The output portion 401 comprises a logic product (AND gate) 304A, a code combiner 401A and a selector 401B. An upper limit value used in the third limiter 104 is the same as the upper limit value used in the second limiter 104.

The code combiner 401A combines the upper limit value with the code data of the PCM format data PO and outputs combined data 401*a*.

The selector 401B selects the combined data 401*a* when the logic product result 304*a* has 'H' level and outputs one as the PCM format data POL. Furthermore, the selector 401B selects the original PCM format data PO when the logic product result 304*a* has 'L' level and outputs one as the PCM format data POL.

According to the third limiter 104, the original PCM format data PO can be output as the PCM format data POL. Therefore, the third limiter 104 can save the time and power dissipation to combine the numerical value data of the PCM format data PO with the code data again.

Next, the operation of the decoding apparatus with the first limiter 104 according to the first preferred embodiment of the present invention will be described with FIG. 5 an follows. As shown in FIG. 5, the decoding apparatus according the first preferred embodiment demodulates the receive signals at timing t1, t2, t3, t4, . . . In this case, the demodulation signal RD at timing t2 has transmission errors. In timing t2, the voltage level of the detection result CRCERR is 'H' level.

Until the point 501 from the point 500, the amplitude value of the PCM format data PO decoded by the ADPCM decoder 102, is lower than the upper limit value and higher than the lower limit value. The limiter 104 outputs the PCM format data PO as the PCM format data POL. Therefore, the PCM decoder 105 decodes the PCM format data PO and outputs the decoded PCM format data PO as the analog voice data AVD.

At the point 501, the PCM format data PO is lower than the lower limit value. The limiter 104 outputs the lower limit value as the PCM format data POL. Therefore, the PCM decoder 105 does not decode the PCM format data PO but the lower limit value, and outputs the decoded lower limit value as the analog voice data AVD.

Until the point 502 from the point 501, the PCM format data PO is lower than the upper limit value and higher than the lower limit value. Therefore, the PCM decoder 105 decodes the PCM format data PO and outputs the decoded PCM format data PO as the analog voice data AVD.

At the point 502, the PCM format data PO is higher than the upper limit value. The limiter 104 outputs the upper limit value as the PCM format data POL. Therefore, the PCM decoder 105 does not decode the PCM format data PO but the upper limit value, and outputs the decoded upper limit value as the analog voice data AVD. Since then, the decoding apparatus conducts the same operation described the above.

The decoding apparatus according to the first preferred embodiment of the present invention has the following effect.

The decoding apparatus according to the first preferred embodiment of the present invention reproduces the limit data (upper limit value or lower limit value) when the receive signal has transmission errors. The decoding apparatus according to the first preferred embodiment can avoid a dumb state in comparison with the conventional decoding apparatus. Therefore, the decoding apparatus according to the first preferred embodiment can be good the quality of a telephone conversation.

(Second Preferred Embodiment)

Figure 6:
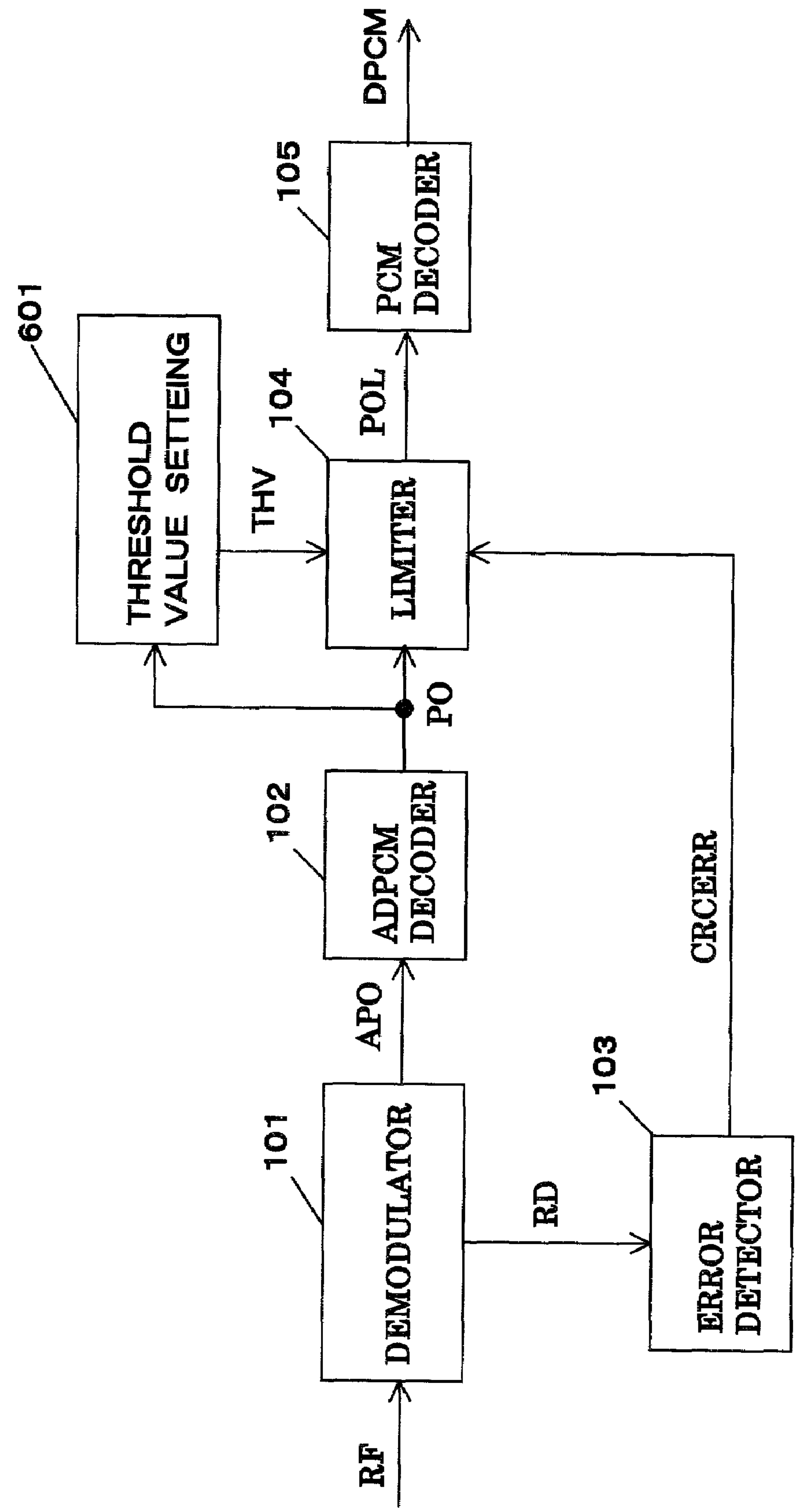
FIG. 6 is a block diagram showing a decoding apparatus according to a second preferred embodiment of the present invention.
Figure 7:
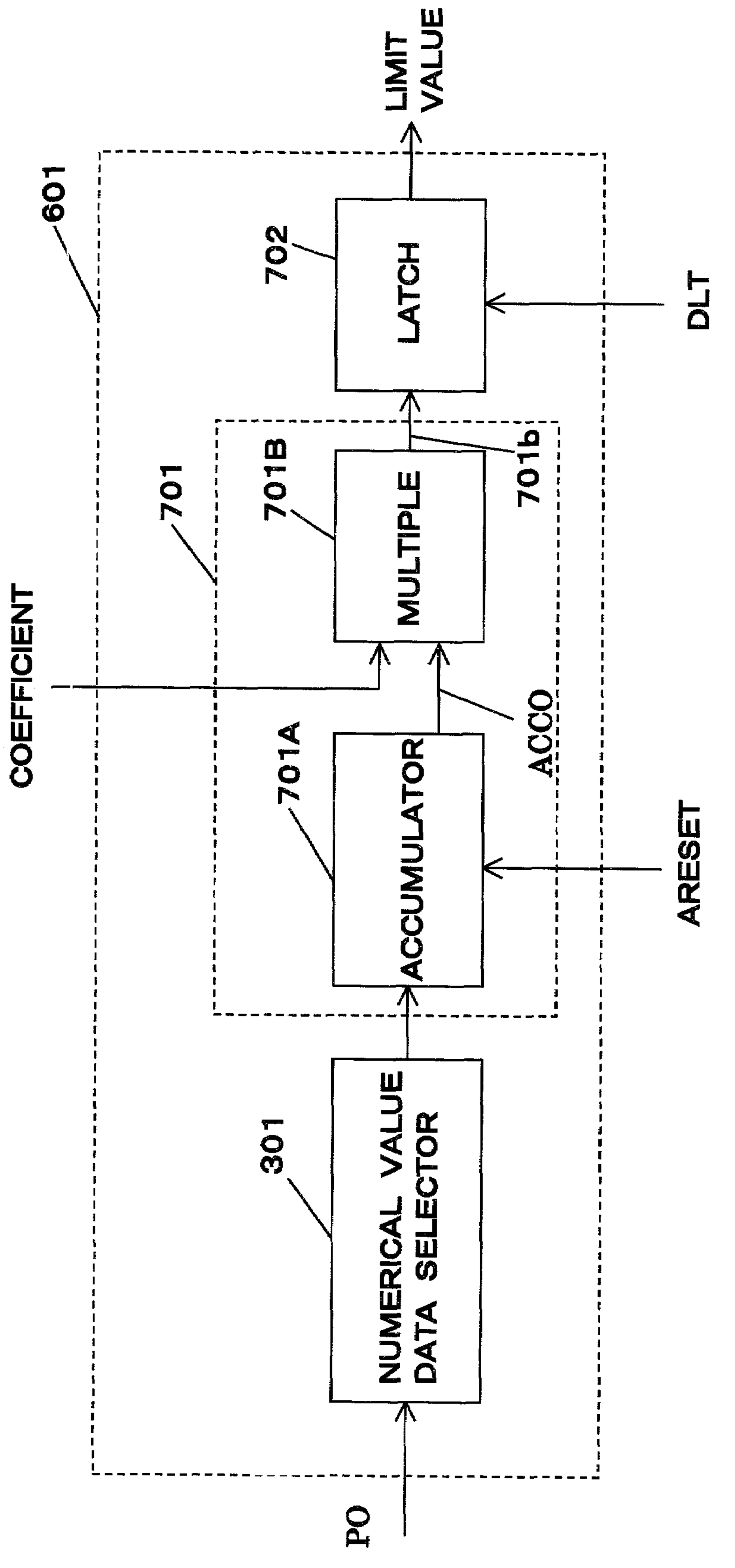
FIG. 7 is a block diagram showing a first threshold value setting portion being used in a second or a fourth preferred embodiments of the present invention.
Figure 8:
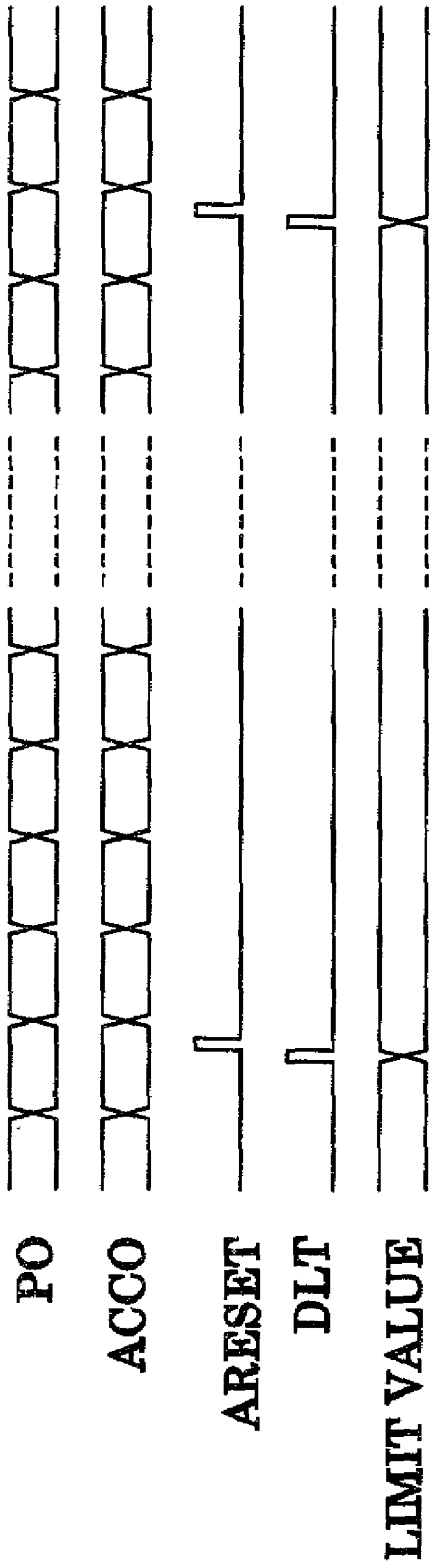
FIG. 8 is a timing chart showing the operation of the first threshold value setting portion.
Figure 9:
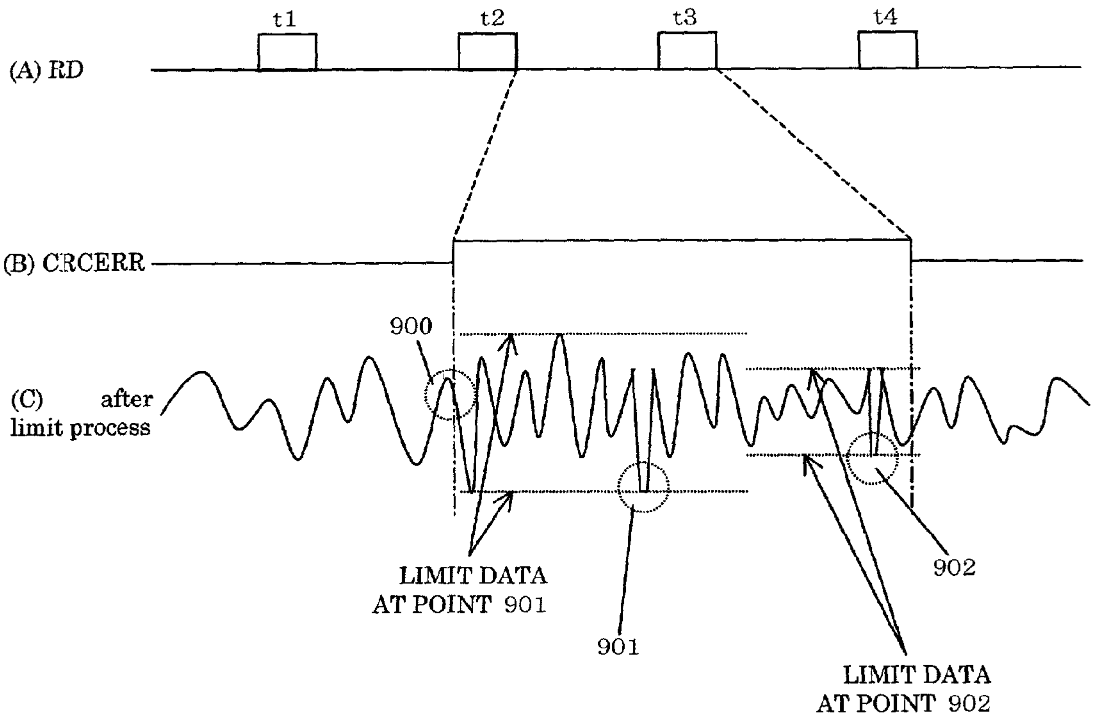
FIG. 9 is a wave form chart output by a decoding apparatus according to a second preferred embodiment of the present invention.

A decoding apparatus for decoding encoded voice signal according to a second preferred embodiment of the present invention will be described with reference to FIGS. 6–9. FIG. 6 is a block diagram showing the structure of the decoding apparatus. FIG. 7 is a block diagram showing the structure of a threshold value setting portion of the decoding apparatus. FIG. 8 is a timing chart showing the operation of the threshold value setting portion of the decoding apparatus. FIG. 9 shows a wave form chart output by the decoding apparatus according to the second preferred embodiment of the present invention. Like elements are given like or corresponding reference numerals in the first preferred embodiment. Thus, dual explanations of the same elements are avoided.

First, the structure and operation of the decoding apparatus according to the second preferred embodiment of the present invention will be described. The decoding apparatus according to the second preferred embodiment of the present invention comprises a demodulator 101, an ADPCM decoder 102, an error detector 103, a limiter 104, a PCM decoder 105 and a threshold value setting portion 601.

The threshold value setting portion 601 calculates the average value of the amplitude value of the PCM format data PO output by the ADPCM decoder 102. The threshold value setting portion 601 outputs the calculated average value as the limit value THV. The moving average method is used as the method for calculating the average value.

Next, the structure and the operation of the threshold value setting portion 601 will be described with FIGS. 7–8 as follows. The threshold value setting portion 601 comprises a numerical value data selector 301, an average calculating portion 701 and a latch portion 702. The average calculating portion 701 comprises an accumulator 701A and a multiple portion 701B.

The accumulator 701A conducts the accumulating operation which is to add the numerical value data of the PCM format data PO and the sum of the numerical value data which is calculated before and to store the addition result ACCO. As shown in FIG. 8, the accumulator 701A receives a one-shot pulse signal ARESET which has 'H' level when the accumulator 701A conducts the accumulating operation at N times (N is a positive number). At this time, the accumulator 701A resets the addition result ACCO which has been stored. The accumulator 701A can output the addition result ACCO either at every each accumulating operation or at every N times in accordance with the calculating method which is applied in the multiple portion 701B.

The multiple portion 701B executes the multiplication operation of the addition result ACCO and a coefficient and obtains the average value 701*b*. When the accumulator 701A outputs the addition result ACCO at every N times, the multiple portion 701B can obtain the average value 701*b* by dividing N into the addition result ACCO. When the coefficient is one the nth power of second, the multiple portion 701B can comprise a shift resistor circuit. It goes without saying that an adder can be used instead of the multiple portion 702A to calculate the average value.

The latch portion 702 stores a new average value 701*b* when a control signal DLT which is a one-shot pulse signal having 'H' level is input (see FIG. 8). The latch portion 702 outputs the stored new average value 701*b* as the limit value. When the control signal DLT which has 'L' level is input, the latch portion 702 does not store the new average value 701*b* and outputs the storing old average value 701*b* as the limit value.

Next, the operation of the decoding apparatus according to the second preferred embodiment of the present invention will be described with FIG. 9 as follows. As shown in FIG. 9, the decoding apparatus according the second preferred embodiment receives the receive signals at timing t1, t2, t3, t4, . . . In this case, the demodulation signal RD at timing t2 has transmission errors. In timing t2, the voltage level of the detection result CRCERR is 'H' level.

Until the point 901 from the point 900, the amplitude value of the PCM format data PO decoded by the ADPCM decoder 102, is lower than the upper limit value and higher than the lower limit value. The limiter 104 outputs the PCM format data PO as the PCM format data POL. Therefore, the PCM decoder 105 decodes the PCM format data PO and outputs the decoded PCM format data as the analog voice data AVD.

At the point 901, the PCM format data PO is lower than the lower limit value. The limiter 104 outputs the lower limit value as the PCM format data POL. Therefore, the PCM decoder 105 does not decode the PCM format data PO but the lower limit value, and outputs the decoded lower limit value as the analog voice data AVD. The limit value at this time is the average value which is calculated in the threshold value setting portion 601 based on N data of the PCM format data PO before the point 901 For example, when the average value is 10, the upper limit value is +10 (plus 10) and the lower limit value is −10 (minus 10).

Until the point 902, from the point 901, the PCM format data PO is lower than the upper limit value and higher than the lower limit value. Therefore, the PCM decoder 105 decodes the PCM format data PO and outputs the decoded PCM format data PO as the analog voice data AVD.

At the point 902, the PCM format data PO is higher than the upper limit value. The limiter 104 outputs the upper limit value as the PCM format data POL. Therefore, the PCM decoder 105 does not decode the PCM format data PO but the upper limit value, and outputs the decoded upper limit value as the analog voice data AVD. The limit value at this time is the average value which is calculated in the threshold value setting portion 601 based on N data of the PCM format: data PO before the point 902. In the second embodiment of the present invention, the limit value is calculated at the two points 901 and 902 and the different limit value are applied. Therefore, it often happens that the different limit value are applied at each point. Since then, the decoding apparatus conducts the same operation described the above.

The decoding apparatus according to the second preferred embodiment of the present invention can have the same effects being described in the first preferred embodiments of the present invention.

Furthermore, the decoding apparatus according to the second preferred embodiment of the present invention can have the following effect.

The decoding apparatus according to the second preferred embodiment of the present invention does not apply the fixed data as the limit value but the no-fixed data which is the average value of the PCM format data PO just before the PCM format data PO exceeds the upper or lower limit data. Therefore, when the receive signal has transmission errors, the decoding apparatus according to the second preferred embodiment can reproduce the voice signal based on an amplitude range of the receive signal continuing just before the receive signal which has transmission errors. Therefore, the decoding apparatus according to the second preferred embodiment can be good the quality of a telephone conversation.

(Third Embodiment)

Figure 10:
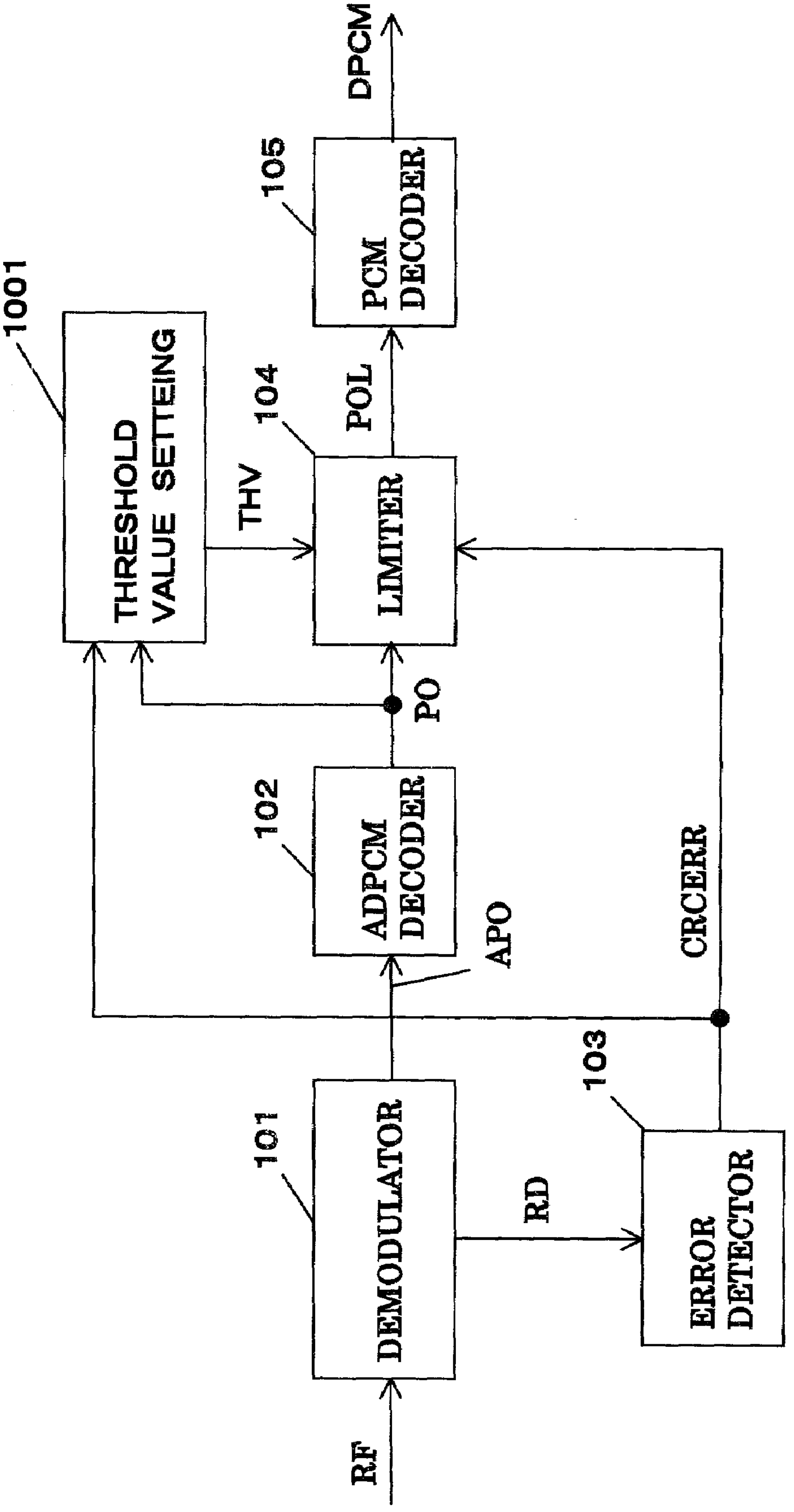
FIG. 10 is a block diagram showing a decoding apparatus according to a third preferred embodiment of the present invention.
Figure 11:
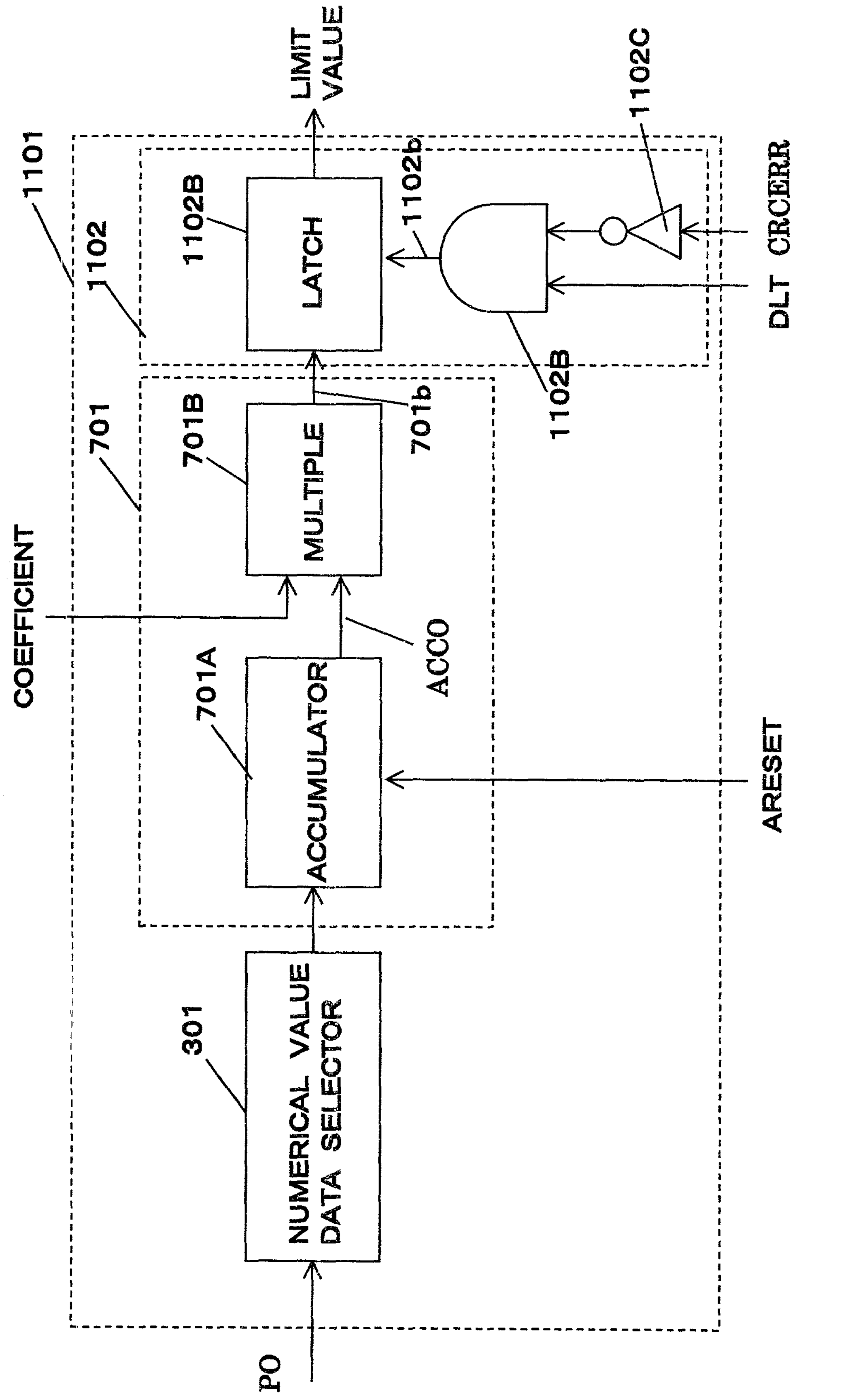
FIG. 11 is a block diagram showing a second threshold value setting portion being used in a third preferred embodiment of the present invention.
Figure 12:
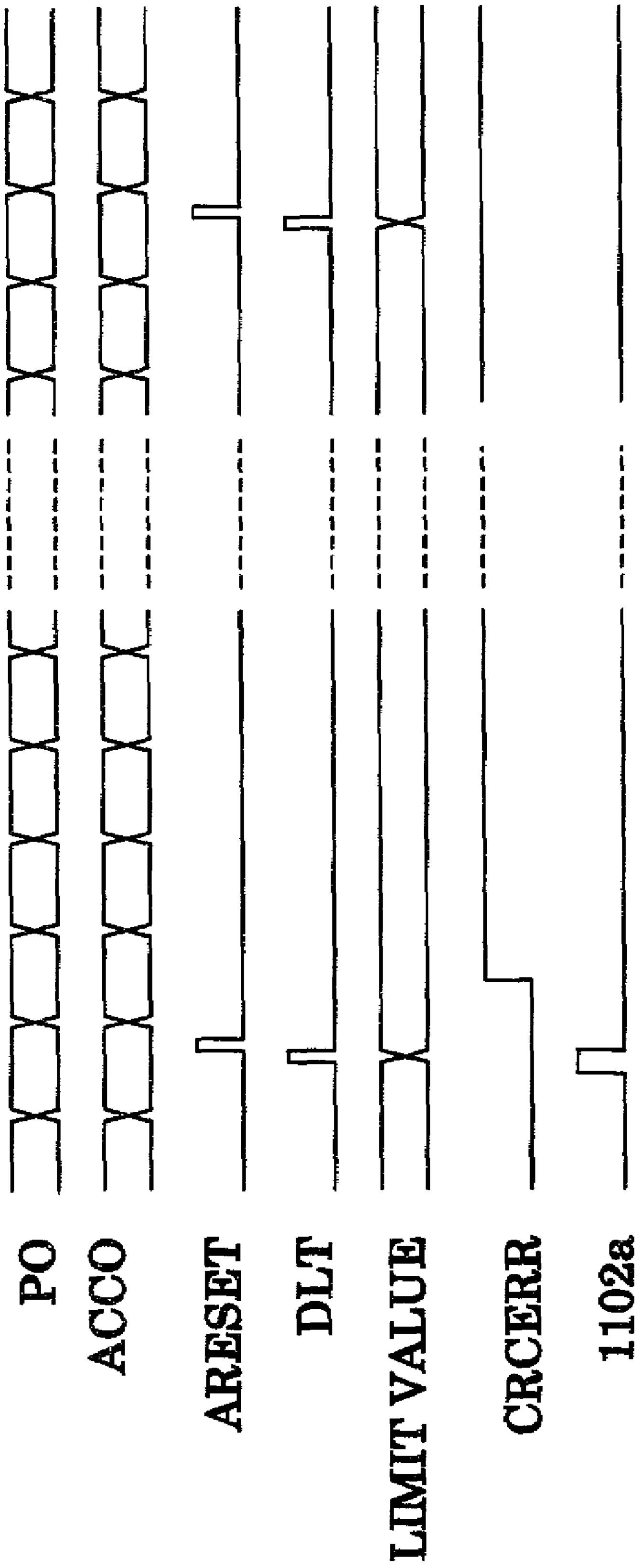
FIG. 12 is a timing chart showing the operation of the second threshold value setting portion.
Figure 13:
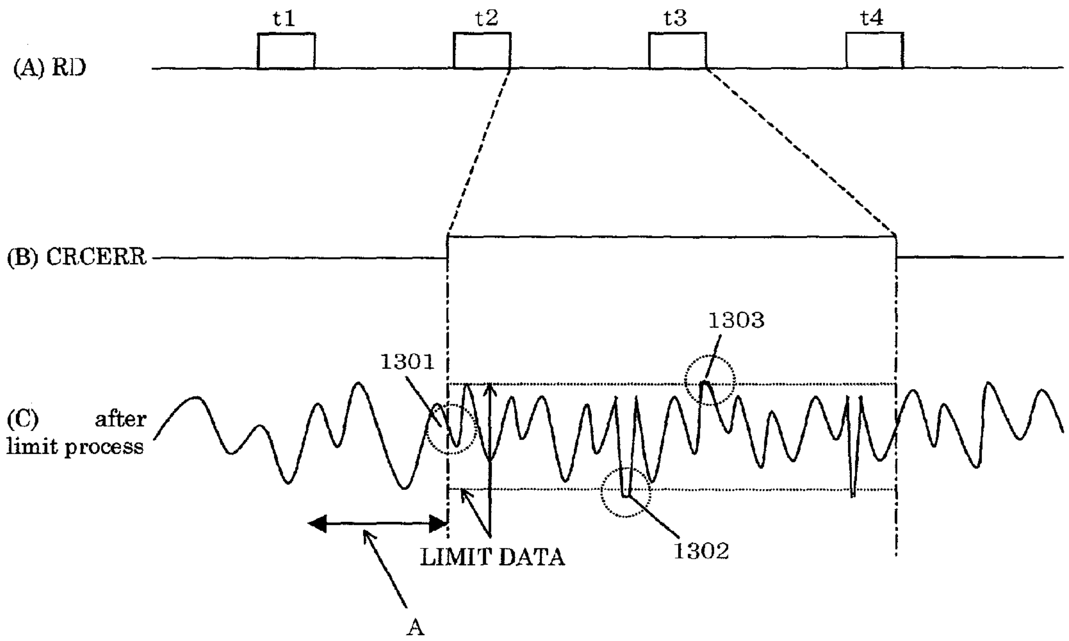
FIG. 13 is a wave form chart output by a decoding apparatus according to a third preferred embodiment of the present invention.

A decoding apparatus for decoding encoded voice signal according to a third preferred embodiment of the present invention will be described with reference to FIGS. 10–13. FIG. 10 is a block diagram showing the structure of the decoding apparatus. FIG. 11 is a block diagram showing the structure of a threshold value setting portion of the decoding apparatus. FIG. 12 is a timing chart showing the operation of the threshold value setting portion of the decoding apparatus. FIG. 13 shows a wave form chart output by the decoding apparatus according to the third preferred embodiment of the present invention. Like elements are given like or corresponding reference numerals in the first or second preferred embodiments. Thus, dual explanations of the same elements are avoided.

First, the structure and operation of the decoding apparatus according to the third preferred embodiment of the present invention will be described. The decoding apparatus according to the third preferred embodiment of the present invention comprises a demodulator 101, an ADPCM decoder 102, an error detector 103, a limiter 104, a PCM decoder 105 and a threshold value setting portion 1001.

The threshold value setting portion 1001 calculates the average value of the absolute value of the amplitude value of the PCM format data PO. The threshold value setting portion 1001 outputs the calculated average value as the limit value THV. The threshold value setting portion 1001 does not use the absolute value of the amplitude value of the PCM format data PO which has transmission errors, in order to calculate the average value.

Next, the structure and the operation of the threshold value setting portion 1001 will be described with FIGS. 11–12 as follows. The threshold value setting portion 1001 comprises a numerical value data selector 301, an average calculating portion 701 and an output portion 1102. The output portion 1102 comprises a logic product (AND gate) 1102A, a latch portion 1102B and an inverter 1102C.

The logic product 1102A operates a logic product between the detection result CRCERR which is inverted by the inverter 1102C and the control signal DLT. When both of the voltage level of the inverted detection result CRCERR and the control signal DLT are 'H' level, the logic product 1102A outputs a logic product result 1102*a* which has 'H' level (see FIG. 12). On the other hand, when the voltage level of the inverted detection result CRCERR or the control signal DLT is 'L' level, the logic product 1102A outputs the logic product result 1102*a* which has 'L' level (see FIG. 12).

The latch portion 1102B stores a new average value 701*b* when the logic product result 1102*a* which is a one-shot pulse signal having 'H' level is input (see FIG. 12). The latch portion 1102B outputs the stored new average value 701*b* as the limit value. When the logic product result 1102*a* which has 'L' level is input, the latch portion 1102B does not store the new average value 701*b* and outputs the storing old average value 701*b* as the limit value. Therefore, the latch portion 1102B does not use the absolute value of the amplitude value of the PCM format data PO which has transmission errors, in order to calculate the average value.

Next, the operation of the decoding apparatus according to the third preferred embodiment of the present invention will be described with FIG. 13 as follows. As shown in FIG. 13, the decoding apparatus according the third preferred embodiment receives the receive signals at timing t1, t2, t3, t4, . . . In this case, the demodulation signal RD at timing t1 does not have transmission errors and the demodulation signal RD at timing t2 has transmission errors. In timing t2, the voltage level of the detection result CRCERR is 'H' level.

Until the point 1302 from the point 1301, the amplitude value of the PCM format data PO decoded by the ADPCM decoder 102, is lower than the upper limit value and higher than the lower limit value. The limiter 104 outputs the PCM format data PO as the PCM format data POL. Therefore, the PCM decoder 105 decodes the PCM format data PO and outputs the decoded PCM format data PO as the analog voice data AVD.

At the point 1302, the PCM format data PO is lower than the lower limit value. The limiter 104 outputs the lower limit value as the PCM format data POL. Therefore, the PCM decoder 105 does not decode the PCM format data PO but the lower limit value, and outputs the decoded lower limit value as the analog voice data AVD. The limit value at this time is the average value which is calculated in the threshold value setting portion 1001 based on N data (A) of the PCM format data PO at timing t1. In other words, N data of the PCM format data PO at timing t2 is not used to calculate the average value. For example, when the average value is 10, the upper limit value is +10 (plus 10) and the lower limit value is −10 (minus 10).

Until the point 1303 from the point 1302, the PCM format data PO is lower than the upper limit value and higher than the lower limit value. Therefore, the PCM decoder 105 decodes the PCM format data PO and outputs the decoded PCM format data PO as the analog voice data AVD.

At the point 1303, the PCM format data PO is higher than the upper limit value. The limiter 104 outputs the upper limit value as the PCM format data POL. Therefore, the PCM decoder 105 does not decode the PCM format data PO but the upper limit value, and outputs the decoded upper limit value as the analog voice data AVD. The limit value at this time is the average value which is calculated based on N data (A) of the PCM format data PO at timing t1. Since then, the decoding apparatus conducts the same operation described the above.

The decoding apparatus according to the third preferred embodiment of the present invention can have the same effects being described in the first and second preferred embodiments of the present invention.

Furthermore, the decoding apparatus according to the third preferred embodiment of the present invention can have the following effect.

The decoding apparatus according to the third preferred embodiment of the present invention does not apply the average value of the absolute value of the PCM format data PO which has transmission errors, but the average value of the absolute value of the PCM format data PO which does not have transmission errors. The decoding apparatus according to the third preferred embodiment can reproduce the voice signal based on the just before receive signal which does not have transmission errors. Therefore, the decoding apparatus according to the third preferred embodiment can be good the quality of a telephone conversation.

(Fourth Embodiment)

Figure 14:
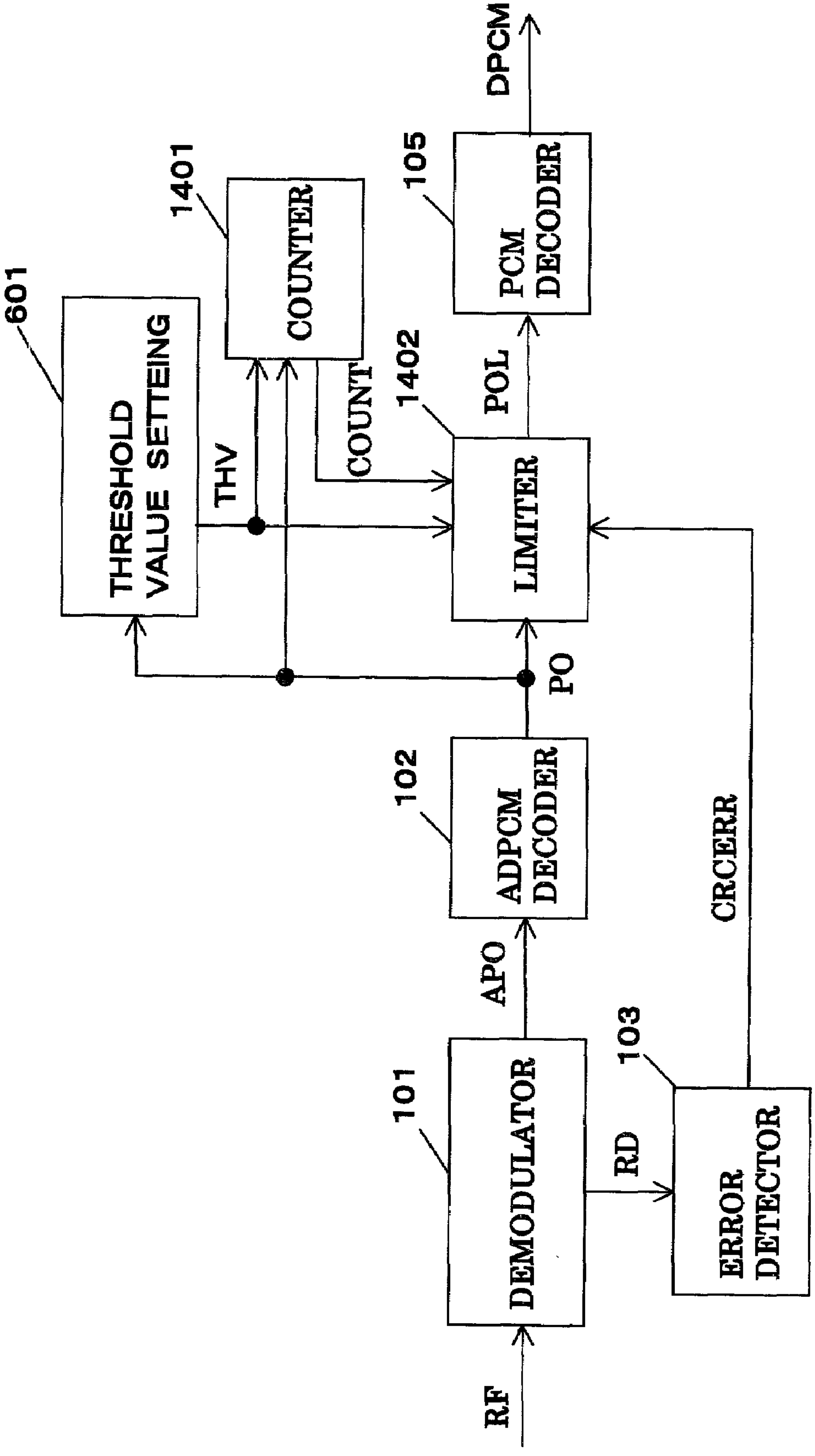
FIG. 14 is a block diagram showing a decoding apparatus according to a fourth preferred embodiment of the present invention.
Figure 15:
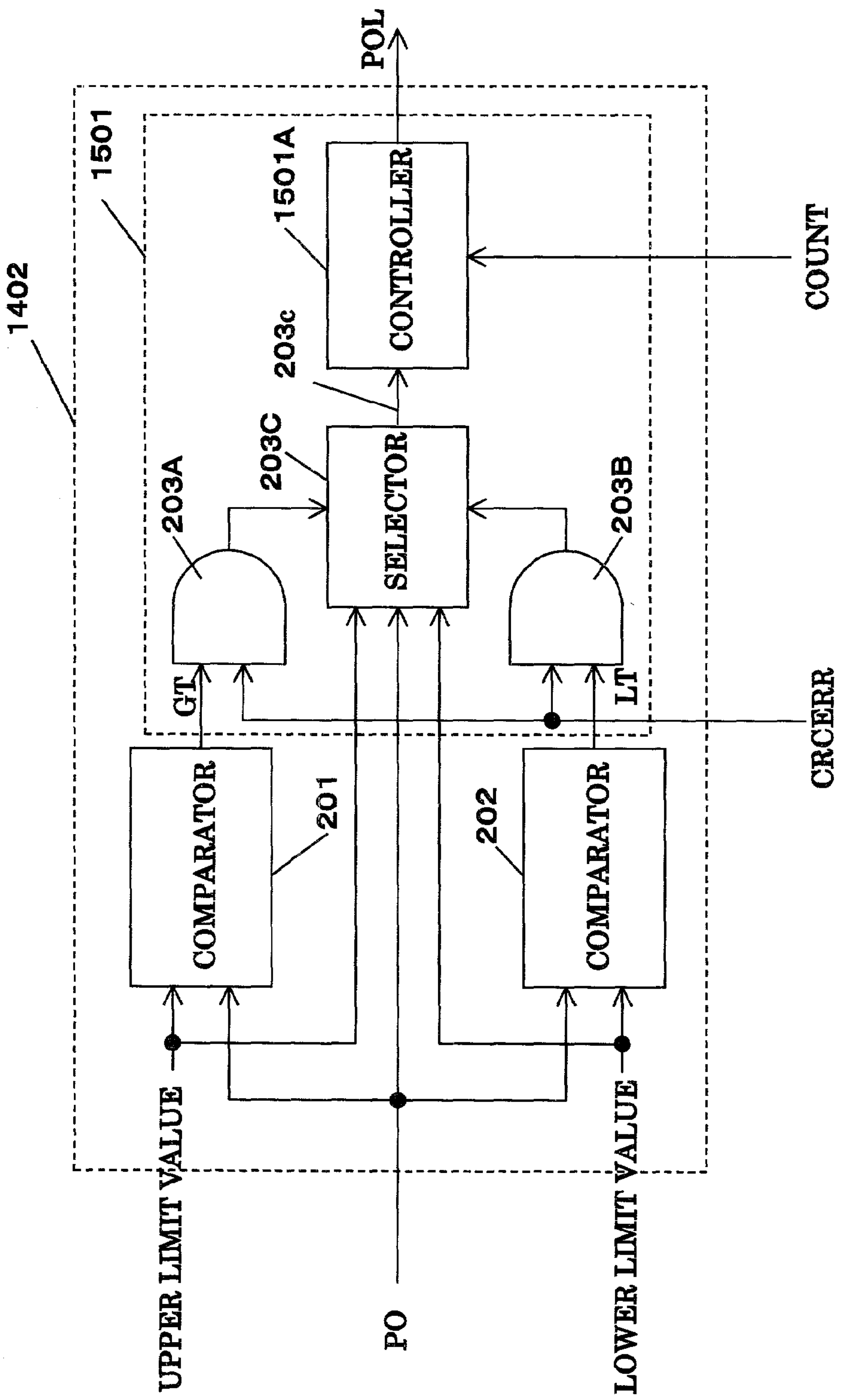
FIG. 15 is a block diagram showing a fourth limiter portion being used in a fourth preferred embodiment of the present invention.
Figure 16:
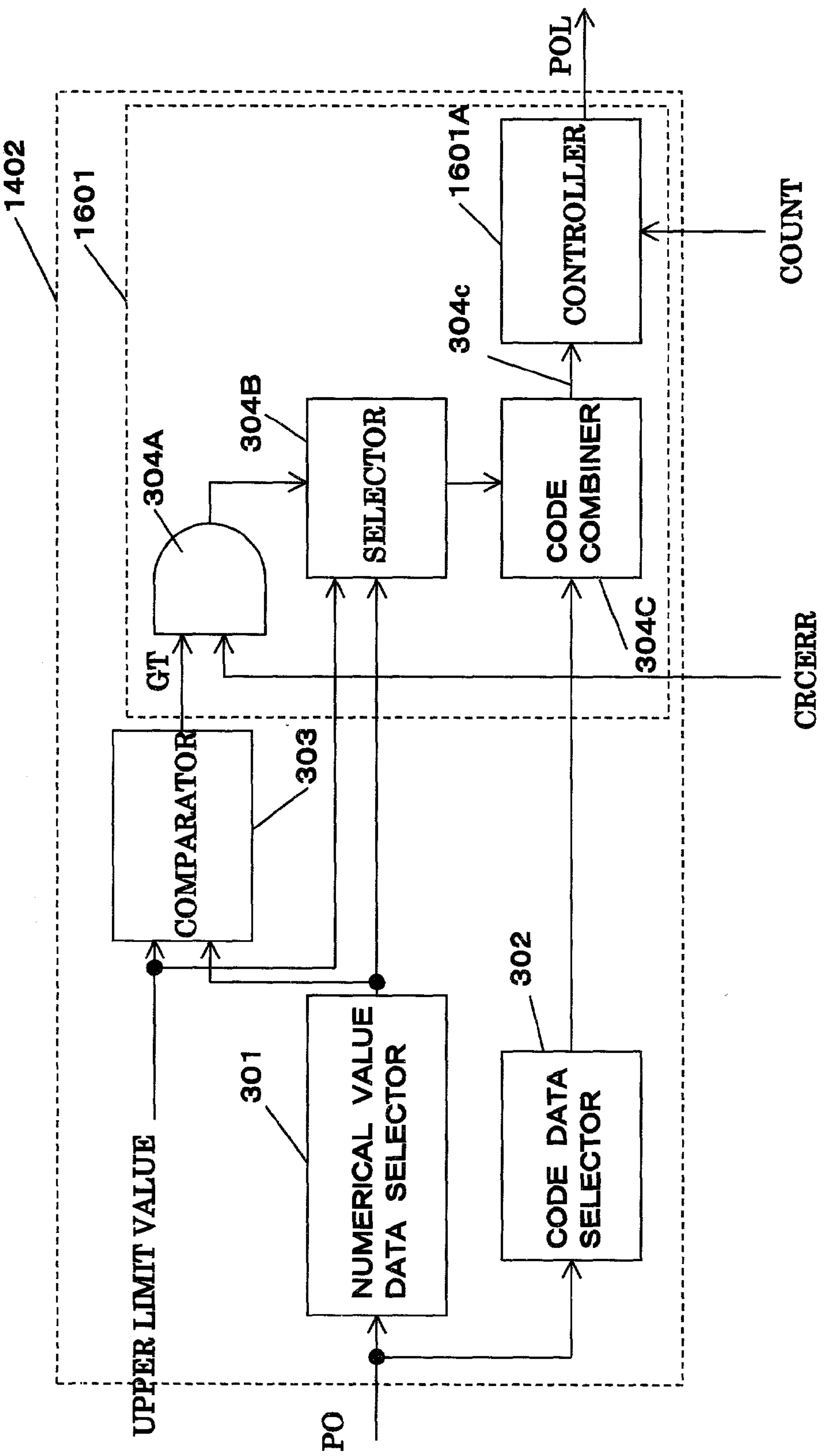
FIG. 16 is a block diagram showing a fifth limiter portion being used in a fourth preferred embodiment of the present invention.
Figure 17:
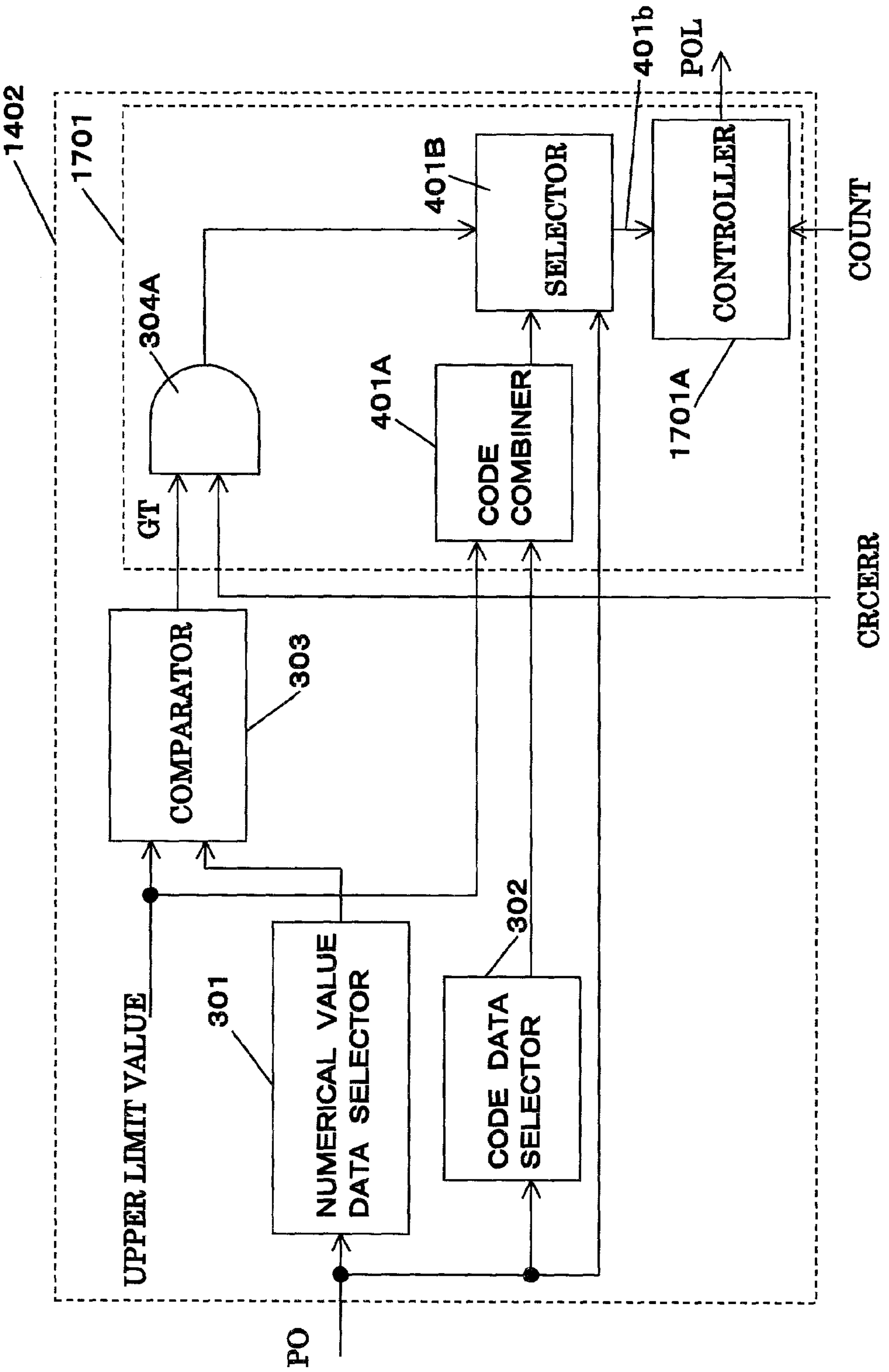
FIG. 17 is a block diagram showing a sixth limiter portion being used in a fourth preferred embodiment of the present invention.
Figure 18:
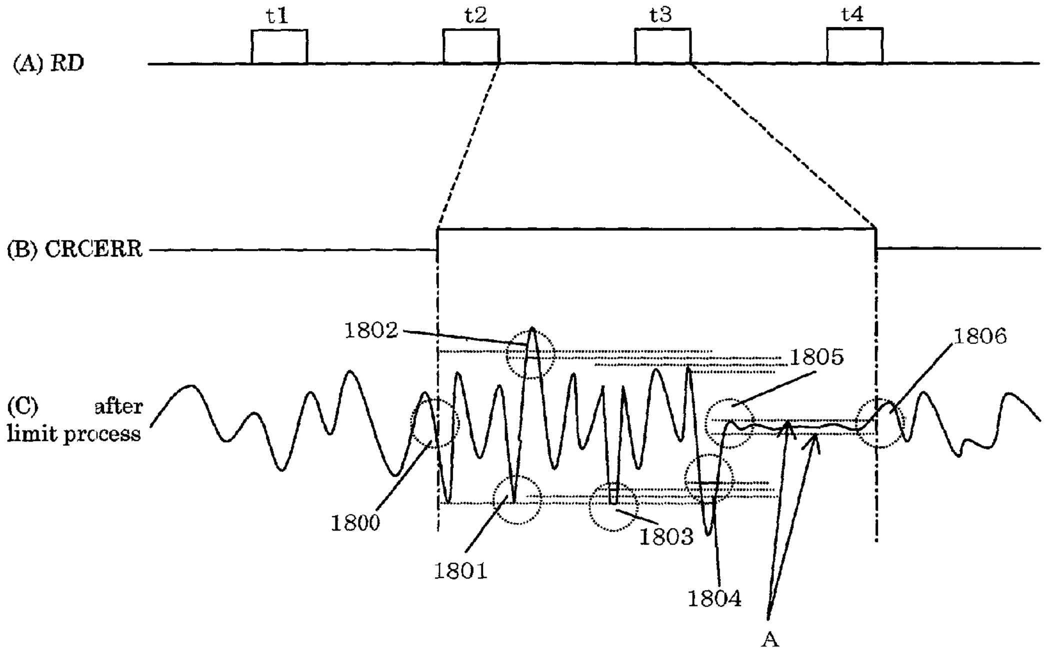
FIG. 18 is a wave form chart output by a decoding apparatus according to a fourth preferred embodiment of the present invention.

A decoding apparatus for decoding encoded voice signal according to a fourth preferred embodiment of the present invention will be described with reference to FIGS. 14–18. FIG. 14 is a block diagram showing the structure of the decoding apparatus having a limiter portion. FIGS. 15–17 are block diagrams showing the structure of the limiter portions of the decoding apparatus. FIG. 18 shows a wave form chart output by the decoding apparatus according to the fourth preferred embodiment of the present invention. Like elements are given like or corresponding reference numerals in the first, second or third preferred embodiments. Thus, dual explanations of the same elements are avoided.

First, the structure and operation of the decoding apparatus according to the fourth preferred embodiment of the present invention will be described. The decoding apparatus according to the fourth preferred embodiment of the present invention comprises at demodulator 101, an ADPCM decoder 102, an error detector 103, a PCM decoder 105, a threshold value setting portion 601, a counter 1401 and a limiter 1402.

The counter 1401 inputs the PCM format data PO which is output by the ADPCM decoder 102 and the limit value THV which is output by the threshold value setting portion 601,. The counter 1401 counts the number of times that the PCM format data PO is over the limit value THV. The counter 1401 outputs a count result COUNT which has 'H' level, when the counted value is over the predetermined value.

The limiter 1402 has a limit value. The limiter 1402 outputs either the PCM format data PO or the limit value as a PCM format data POL in accordance with the voltage level of the detection result CRCERR. In addition, the limiter 1402 conducts either outputting the PCM format data POL of which value is very small or stopping outputting the PCM format data POL, when the count result COUNT is input. The limiter 1402 will be described with reference to FIGS. 15–17 in detail.

First, the fourth limiter 1402 will be described with FIG. 15 as follows. The fourth limiter 1402 comprises a comparator 201, a comparator 202 and an output portion 1501. The output portion 1501 comprises a logic product (AND gate) 203A, a logic product 203B, a selector 203C and a controller 1501A. The fourth limiter 1402 has an upper limit value and a lower limit value. The user can freely set the upper limit value and the lower limit value. For example, the user can set the upper limit value which is calculated by the threshold value setting portion 601 and the lower limit value which is the reversed upper limit value.

The selector 203C outputs the upper limit value as a selected data 203*c* when the logic product result 203*a* has 'H' level and the lower limit value as the selected data 203*c* when the logic product result 203*b* has 'H' level. Furthermore, the selector 203C outputs the PCM format data PO as the selected data 203*c* when both the logic product result 203*a* and the logic product result 203*b* has 'L' level.

The controller 1501A outputs the selected data 203*c* as the PCM format data POL when the count result COUNT has 'L' level. On the other hand, the controller 1501A does not output the original selected data 203*c* as the PCM formal data POL when the count result COUNT has 'H' level. At this time, the controller 1501A conducts whether outputting the PCM format data POL which is very small or stopping outputting the PCM format data POL.

According to the fourth limiter 1402, the upper limit value and the lower limit value can be set up, individually and freely. Therefore, the user can obtain the analog voice signal which has a desired band.

Next, the fifth limiter 1402 will be described with FIG. 16 as follows. The fifth limiter 1402 comprises a numerical value data selector 301, a code data selector 302, a comparator 303 and an output portion 1601. The output portion 1601 comprises a logic product (AND gate) 304A, a selector 304B, a code combiner 304C and a controller 1601A. The fifth limiter 1402 has an upper limit value of which format is the absolute value. The upper limit value is calculated by the threshold value setting portion 601.

The code combiner 304C combines the selection result 304*b* with the code data of the PCM format data PO and outputs one as the combined data 304*c*.

The controller 1601A outputs the combined data 304*c* as the PCM format data POL when the count result COUNT has 'L' level. On the other hand, the controller 1601A does not output the original combined data 304*c* as the PCM format data POL when the count result COUNT has 'H' level. At this time, the controller 1601A conducts whether outputting the PCM format data POL which is very small or stopping outputting the PCM format data POL.

According to the fifth limiter 1402, the upper limit value and the lower limit value of the fourth limiter can be combined as one limit value. Therefore, the fifth limiter 1402 can save the capacitance of the memory which stores the limit value.

Next, the sixth limiter 1402 will be described with FIG. 17 as follows. The sixth limiter 1402 comprises a numerical value data selector 301, a code data selector 302, a comparator 303 and an output portion 1701. The output portion 1701 comprises a logic product (AND gate) 304A, a code combiner 401A, a selector 401B and a controller 1701A. An upper limit value is calculated by the threshold value setting portion 601.

The selector 401B selects the combined data 401*a* when the logic product result 304*a* has 'H' level and outputs one as the selected data 401*b*. Furthermore, the selector 401B selects the PCM format data PO when the logic product result 304*a* has 'L' level and outputs one as the selected data 401*b*.

The controller 1701A outputs the selected data 401*b* as the PCM format data POL when the count result COUNT has 'L' level. On the other hand, the controller 1701A does not output the original selected data 401*b* as the PCM format data POL when the count result COUNT has 'H' level. At this time, the controller 1701A conducts whether outputting the PCM format data POL which is very small or stopping outputting the PCM format data POL.

According to the sixth limiter 1402, the original PCM format data PO can be output as the PCM format data POL. Therefore, the sixth limiter 1402 can save the time and power dissipation to combine the numerical value data of the PCM formal data PO with the code data again.

Next, the operation of the decoding apparatus with the fourth limiter 1402 according to the fourth preferred embodiment of the present invention will be described with FIG. 18 as follows. As shown in FIG. 18, the decoding apparatus according the fourth preferred embodiment demodulates the receive signals at timing t1, t2, t3, t4, . . . In this case, the demodulation signal RD at timing t2 has transmission errors. In timing t2, the voltage level of the detection result CRCERR is 'H' level.

Until the point 1801 from the point 1800, the PCM format data PO decoded by the ADPCM decoder 102, is lower than the upper limit value and higher than the lower limit value. The limiter 1402 outputs the PCM format data PO as the PCM format data POL. Therefore, the PCM decoder 105 decodes the PCM format data PO and outputs the decoded PCM format data AVD.

At the point 1801, the PCM format data PO is lower than the lower limit value. The limit value at this time is the average value which is calculated in the threshold value setting portion 601 based on N data of the PCM format data PO before the point 1801. The limiter 1402 outputs the lower limit value as the PCM format data POL. Therefore, the PCM decoder 105 does not decode the PCM format data PO but the lower limit value, and outputs the decoded lower limit value as the analog voice data AVD. Whenever the PCM format data PO is higher than the upper limit value or lower than the lower limit value, the counter 1401 conducts an increment operation of the count by ones. It goes without saying that the counter 1401 conducts a decrement operation of the count by ones instead of the increment operation.

Until the point 1802 from the point 1801, the PCM format data PO is lower than the upper limit value and higher than the lower limit value. The limit value at this time is the average value which is calculated in the threshold value setting portion 601 based on N data of the PCM format data PO before each point. Therefore, the PCM decoder 105 decodes the PCM format data PO and outputs the decoded PCM format data PO as the analog voice data AVD.

At the point 1802, the PCM format data PO is higher than the upper limit value. The limit value at this time is the average value which is calculated in the threshold value setting portion 601 based on N data of the PCM format data PO before the point 1802. The limiter 104 outputs the upper limit value as the PCM format data POL. Therefore, the PCM decoder 105 does not decode the PCM format data PO but the upper limit value, and outputs the decoded upper limit value as the analog voice data AVD. The counter 1401 conducts an increment operation of the count by ones. Since then, the decoding apparatus conducts the same operation described the above.

At the point 1805, the limiter 1402 receives the count result COUNT has 'H' level. Until the point 1806 from the point 1805 (term A), the limiter 1402 conducts whether outputting the PCM format data POL which is very small or stopping outputting the PCM format data POL.

The decoding apparatus according to the fourth preferred embodiment of the present invention can have the same effects being described in the first and second preferred embodiments of the present invention.

Furthermore, the decoding apparatus according to the fourth preferred embodiment of the present invention can have the following effect.

The decoding apparatus according to the fourth preferred embodiment of the present invention does not output the PCM format data PO when the total number, the PCM format data PO is over the limit value THV, exceeds the predetermined number. The decoding apparatus according to the fourth preferred embodiment does not reproduce the voice signal having a lot of the transmission errors. Therefore, The decoding apparatus according to the fourth preferred embodiment can control occurring noise. Thus, the decoding apparatus according to the fourth preferred embodiment can be good the quality of a telephone conversation.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. An apparatus for decoding encoded voice data comprising:

- a demodulator which demodulates said encoded voice data and which outputs demodulated encoded voice data;
- an adaptive differential pulse code modulation decoder which decodes said demodulated encoded voice data and which produces pulse code modulation data;
- an error detector which detects whether error is present in said encoded voice data and which outputs a detection result; and
- a limiter which outputs said pulse code modulation data when the pulse code modulation data is within a range from an upper limit value to a lower limit value, outputs the upper limit value when the pulse code modulation value is greater than the upper limit value, and outputs the lower limit value when the pulse code modulation data is lower than the lower limit value, only when error occurs.

2. The apparatus for decoding encoded voice data according to claim 1, further comprising:

- a first comparator which compares said pulse code modulation data and said upper limit value and which outputs a first comparison result;
- a second comparator which compares said pulse code modulation data and said lower limit value and which outputs a second comparison result; and
- a first output portion which outputs said pulse code modulation data, said upper limit value or said lower limit value in accordance with said detection result and said first and second comparison results.

3. The apparatus for decoding encoded voice data according to claim 2, wherein said first output portion comprises:

- a first logic circuit which outputs a first logic circuit result having a first voltage level when both a voltage level of said first comparison result and of said detection result are said first voltage level;
- a second logic circuit which outputs a second logic circuit result having said first voltage level when both a voltage level of said second comparison result and of said detection result are said first voltage level; and
- a selector which selects said upper limit value when said first logic circuit result having said first voltage level is input, selects said lower limit value when said second logic circuit result having said first voltage level is input, or selects said pulse code modulation data when said first and second logic circuit results, each not having said first voltage level, is input.

4. The apparatus for decoding encoded voice data according to claim 1, wherein the upper limit value is a largest amplitude value of a voice signal at which the reproduced voice signal does not have noise, and the lower limit value is the smallest amplitude value of a voice signal at which the reproduced voice signal does not have noise.

5. The apparatus for decoding encoded voice data according to claim 1, wherein the upper limit value and the lower limit value are set individually and freely.

6. An apparatus for decoding encoded voice data comprising:

- a demodulator which demodulates said encoded voice data and which outputs demodulated encoded voice data:
- an adaptive differential pulse code modulation decoder which decodes said demodulated encoded voice data and which produces pulse code modulation data;
- an error detector which detects whether an error is present in said encoded voice data and which outputs a detection result;
- a threshold value setting portion which calculates limit data based on said pulse code modulation data and which outputs said limit data, wherein the threshold value setting portion comprises:
- an average calculating portion which calculates an average value of numerical value data of said pulse code modulation data and which outputs said average value;
- a latch portion which latches said average value and which outputs said stored average value based on a voltage level of a control signal; and
- a limiter which outputs either said pulse code modulation data or said limit data in accordance with said detection result.

7. The apparatus for decoding encoded voice data according to claim 6, wherein said average calculating portion comprises:

- an accumulator which executes an addition of said numerical value data of said pulse code modulation data and a stored value, which replaces said stored value with an addition result, and which outputs said addition result; and a multiple portion which executes a multiple operation of said addition result and a coefficient.

8. An apparatus for decoding encoded voice data comprising:

a demodulator which demodulates said encoded voice data and which outputs demodulated encoded voice data:

an adaptive differential pulse code modulation decoder which decodes said demodulated encoded voice data and which produces pulse code modulation data;

an error detector which detects whether an error is present in said encoded voice data and which outputs a detection result;

a threshold value setting portion which calculates limit data based on said pulse code modulation data and which outputs said limit data;

a counter which counts the number of times that said pulse code modulation data is over said limit data and which outputs a count result having a voltage level when said count result is over a predetermined value; and a limiter which outputs either said pulse code modulation data or said limit data in accordance with said detection result, and which outputs the selected data in accordance with said count result.

9. The apparatus for decoding encoded voice data according to claim 8, wherein said limit data has an upper limit value; and a lower limit value; and wherein said limiter comprises:

a first comparator which compares said pulse code modulation data and said upper limit value and which outputs a first comparison result;

a second comparator which compares said pulse code modulation data and said lower limit value and which outputs a second comparison result; and an output portion which does not output said pulse code modulation data when said count result is input having said voltage level.

10. The apparatus for decoding encoded voice data according to claim 9, wherein said output portion comprises:

a first logic circuit which outputs a first logic circuit result having said voltage level when both a voltage level of said first comparison result and of said detection result are said voltage level;

a second logic circuit which outputs a second logic circuit result having said voltage level when both a voltage level of said second comparison result and of said detection result are said voltage level;

a first selector which selects said upper limit value when said first logic circuit result having said voltage level is input, selects said lower limit value when said second logic circuit result having said voltage level is input, or selects said pulse code modulation data when said first and second logic circuit results, each not having said voltage level, is input; and a controller which does not output said data output by said first selector when said count result is input having said voltage level.

11. The apparatus for decoding encoded voice data according to claim 8, wherein a format of said limit data is the absolute value; and wherein said limiter portion comprises:

a comparator which compares a numerical value data of said pulse code modulation data and said limit data and which outputs a comparison result; and an output portion which does not output said pulse code modulation data or said limit data when said count result is input having said voltage level.

12. The apparatus for decoding encoded voice data according to claim 11, wherein said output portion comprises:

a logic circuit which outputs a logic circuit result having said voltage level when both a voltage level of said comparison result and of said detection result are said voltage level;

a selector which selects said limit data when said logic circuit result having said voltage level is input or said numerical value data when said logic circuit result having said voltage level is not input;

a combiner which combines code data of said pulse code modulation data and said data selected by said selector and which outputs combined data; and a controller which does not output said combined data output by said combiner when said count result is input having said voltage level.

13. The apparatus for decoding encoded voice data according to claim 11, wherein said output portion comprises:

a logic circuit which outputs a logic circuit result having said voltage level when both a voltage level of said comparison result and of said detection result are said voltage level;

a combiner which combines code data of said pulse code modulation data and said limit data and which outputs combined limit data; and a selector which does not select said combined limit data and said pulse code modulation when said count result is input having said voltage level.

14. An apparatus for decoding encoded voice data comprising:

a demodulator which demodulates said encoded voice data and which outputs demodulated encoded voice data;

an adaptive differential pulse code modulation decoder which decodes said demodulated encoded voice data and which produces pulse code modulation data;

an error detector which detects whether error is present in said encoded voice data and which outputs a detection result;

a threshold value setting portion which calculates limit data based on said pulse code modulation data produced at a term and which outputs said limit data, wherein said term is a term that a transmission error is not present in said encoded voice signal, and wherein the threshold value setting portion comprises:

an average calculating portion which calculates an average value of numerical value data of said pulse code modulation data and which outputs said average value;

an output portion which stores said average value based on the voltage levels of a control signal and said detection result and which outputs a stored average value as said limit data; and a limiter which outputs either said pulse code modulation data or said limit data in accordance with said detection result.

15. The apparatus for decoding encoded voice data according to claim 14, wherein said output portion comprises:

a logic circuit which outputs a logic circuit result having a first voltage level when a voltage level of said control signal is said first voltage level and when a voltage level of said detection result is a second voltage level; and a latch portion which stores said average value based on a voltage level of said logic circuit result and which outputs a stored average value.

* * * * *